United States Patent
Lee et al.

(10) Patent No.: US 11,656,706 B2
(45) Date of Patent: May 23, 2023

(54) TOUCH DISPLAY APPARATUS

(71) Applicant: LG Display Co., Ltd., Seoul (KR)

(72) Inventors: Yang Sik Lee, Seoul (KR); Hwi Deuk Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/556,866

(22) Filed: Dec. 20, 2021

(65) Prior Publication Data
US 2022/0206618 A1   Jun. 30, 2022

(30) Foreign Application Priority Data

Dec. 31, 2020  (KR) ........................ 10-2020-0189506

(51) Int. Cl.
*G06F 3/041*  (2006.01)
*H01L 27/32*  (2006.01)
*H01L 51/52*  (2006.01)

(52) U.S. Cl.
CPC .......... *G06F 3/0412* (2013.01); *H01L 27/323* (2013.01); *H01L 27/3246* (2013.01); *H01L 27/3276* (2013.01); *H01L 51/5237* (2013.01)

(58) Field of Classification Search
CPC . G06F 3/0412; H01L 27/323; H01L 27/3246; H01L 27/3276; H01L 51/5237
See application file for complete search history.

(56) References Cited

U.S. PATENT DOCUMENTS

| | | | |
|---|---|---|---|
| 10,332,943 B2 | 6/2019 | Seo et al. | |
| 10,627,966 B2 | 4/2020 | Na | |
| 11,073,928 B2 | 7/2021 | Lee et al. | |
| 11,315,986 B2* | 4/2022 | Kim | G06F 3/0443 |
| 2017/0160852 A1 | 6/2017 | Ahn et al. | |
| 2020/0150826 A1 | 5/2020 | Hwang | |
| 2020/0241664 A1 | 7/2020 | Lee et al. | |
| 2022/0066595 A1* | 3/2022 | Kang | G06F 3/0443 |
| 2022/0066613 A1* | 3/2022 | Yuan | H01L 27/3276 |

FOREIGN PATENT DOCUMENTS

| | | |
|---|---|---|
| KR | 10-2014-0060966 A | 5/2014 |
| KR | 10-2015-0144258 A | 12/2015 |
| KR | 10-1617140 B1 | 5/2016 |
| KR | 10-2017-0067093 A | 6/2017 |
| KR | 10-2018-0025774 A | 3/2018 |
| KR | 10-2018-0043528 A | 4/2018 |
| KR | 10-2018-0059035 A | 6/2018 |
| KR | 10-2020-0037760 A | 4/2020 |
| KR | 10-2020-0054412 A | 5/2020 |
| KR | 10-2020-0057981 A | 5/2020 |
| KR | 10-2020-0094896 A | 8/2020 |

* cited by examiner

*Primary Examiner* — Afroza Chowdhury
(74) *Attorney, Agent, or Firm* — Seed IP Law Group LLP

(57) ABSTRACT

A touch display apparatus sensing a touch of a user and/or a tool is provided. The touch display apparatus may include a light-emitting device including an upper electrode which extends in a first direction, an encapsulating element on the upper electrode, a touch wire on the encapsulating element and a link wire disposed between a device substrate and the light-emitting device, wherein the link wire is connected to the upper electrode of the light-emitting device, and wherein the touch wire includes a portion overlapping with the upper electrode of the light-emitting device. Thus, in the touch display apparatus, a process of forming components for sensing the touch may be simplified.

18 Claims, 5 Drawing Sheets

TOUCH DISPLAY APPARATUS

CROSS-REFERENCE TO RELATED APPLICATION(S)

This application claims the benefit of Korean Patent Application No. 10-2020-0189506 filed on Dec. 31, 2020, which is hereby incorporated by reference as if fully set forth herein.

BACKGROUND

Technical Field

The present disclosure relates to a touch display apparatus sensing a user and/or a tool.

Description of the Related Art

Generally, an electronic appliance, such as a monitor, a TV, a laptop computer and a digital camera, includes a display apparatus capable of realizing an image. For example, the display apparatus may include light-emitting devices. Each of the light-emitting devices may emit light displaying a specific color. For example, each of the light-emitting devices may include a light-emitting layer disposed between two emission electrodes.

The display apparatus may be a touch display apparatus which senses a touch of a user and/or a tool, and applies a specific signal. For example, the touch display apparatus may include a touch structure which is independently controlled with the light-emitting devices. The touch structure may be disposed on the light-emitting devices. For example, the touch structure may include touch electrodes which are disposed side by side on an encapsulating element covering the light-emitting devices. The touch electrodes may be connected in a first direction or a second direction perpendicular to the first direction. Thus, in the touch display apparatus, a process of forming the touch structure may be complicated.

BRIEF SUMMARY

Accordingly, the present disclosure is directed to a touch display apparatus that substantially obviates one or more problems due to limitations and disadvantages of the related art.

An advantage of the present disclosure is to provide a touch display apparatus in which a process of forming a component for sensing a touch of a user and/or a tool is simplified.

Additional advantages and features of the disclosure will be set forth in part in the description which follows and in part will become apparent to those having ordinary skill in the art upon examination of the following or may be learned from practice of the disclosure. The features and other advantages of the disclosure may be realized and attained by the structure particularly pointed out in the written description and claims hereof as well as the appended drawings.

To achieve these features and other advantages and in accordance with the purpose of the disclosure, as embodied and broadly described herein, there is provided a touch display apparatus comprising a device substrate. The device substrate includes emission areas. Pixel electrodes and a bank insulating layer are disposed on the device substrate. Each of the pixel electrodes is disposed on one of the emission areas. The bank insulating layer covers an edge of each pixel electrode. Each of light-emitting layers is disposed on a portion of one of the pixel electrodes which is exposed by the bank insulating layer. A first upper electrode is disposed on the bank insulating layer and the light-emitting layers. The first upper electrode extends in a first direction. A first link wire is disposed between the device substrate and the bank insulating layer. The first link wire is connected to the first upper electrode. An encapsulating element is disposed on the first upper electrode. Touch wire is disposed on the encapsulating element. The touch wire includes a portion overlapping with the first upper electrode.

The touch wire may extend in a second direction perpendicular to the first direction.

A second link wire may be disposed between the device substrate and the bank insulating layer. A second upper electrode connected to the second link wire may extend side by side with the first upper electrode. The second link wire may be spaced away from the first link wire.

The second upper electrode may include the same material as the first upper electrode.

The second link wire may include the same material as the first link wire.

The first upper electrode may be insulated from the second link wire. The second upper electrode may be insulated from the first link wire.

The emission areas may be arranged in a zig-zag shape. The first upper electrode and the second upper electrode may extend in a zig-zag shape.

The second upper electrode may extend between the emission areas.

The touch wire may extend between the emission areas.

A separating partition may be disposed on the bank insulating layer. The separating partition may have a side of reverse taper. The separating partition may extend along an edge of the first upper electrode.

In accordance with various embodiments, a touch display apparatus includes a device substrate having emission areas and a non-emission area disposed outside the emission areas. Light-emitting layers overlap respective emission areas of the device substrate. An upper electrode includes first and second upper electrodes extending in a first direction. The first upper electrode overlaps the light-emitting layers. The second upper electrode is offset from the first upper electrode in a second direction perpendicular to the first direction. An encapsulating element is on the upper electrode. A touch wire is on the encapsulating element, and extends in the second direction.

In accordance with various embodiments, a method includes: forming a first link wire and a second link wire on a non-emission area of a device substrate; forming a pixel electrode on an emission area of the device substrate; forming a bank layer having openings exposing the first link wire, the second link wire and the pixel electrode; forming a light-emitting layer on the pixel electrode and the bank layer; forming a first upper electrode and a second upper electrode, the first upper electrode being connected to the first link wire through the bank layer, the second upper electrode being connected to the second link wire through the bank layer; forming an encapsulating element on the first upper electrode and the second upper electrode; and forming a touch wire on the encapsulating element.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
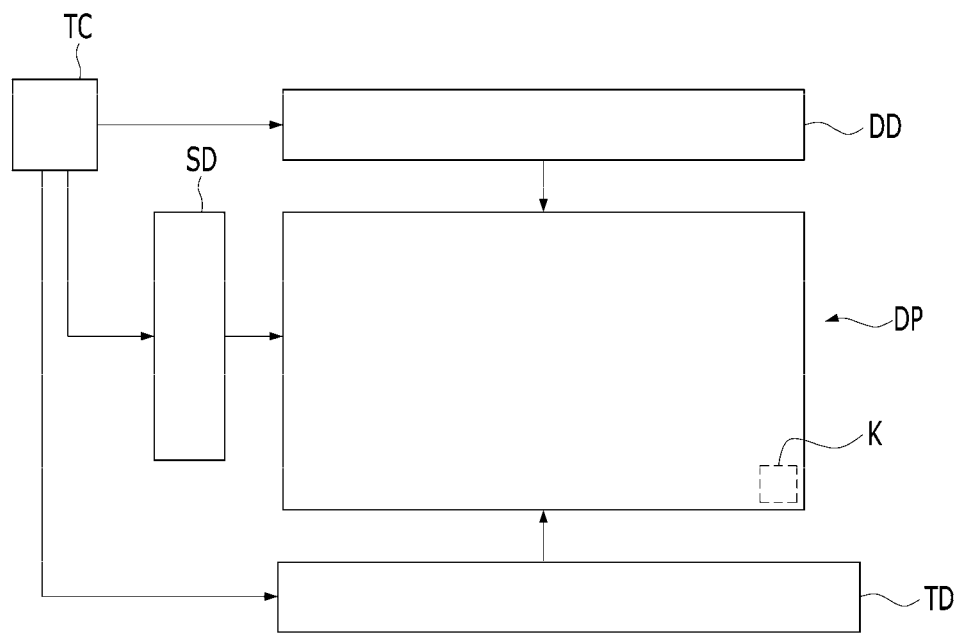
FIG. 1 is a view schematically showing a touch display apparatus according to an embodiment of the present disclosure.

Hereinafter, details related to the above features, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical spirit of the present disclosure to be satisfactorily transferred to those skilled in the art, and thus the present disclosure may be embodied in other forms and is not limited to the embodiments described below.

In addition, the same or highly similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element from another element. However, the first element and the second element may be arbitrarily named according to the convenience of those skilled in the art without departing the technical spirit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
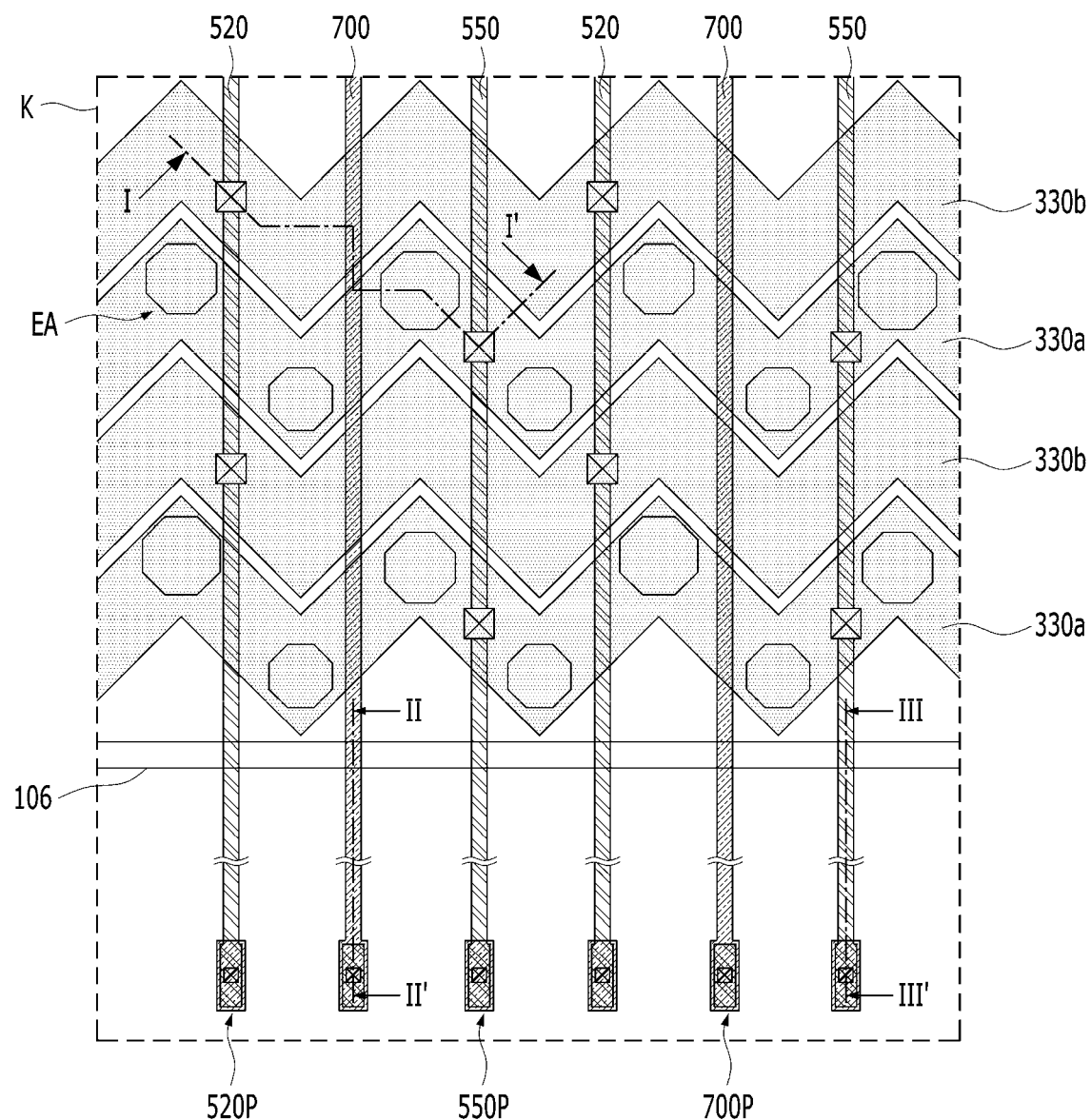
FIG. 2 is an enlarged view of K region in FIG. 1.
Figure 3:
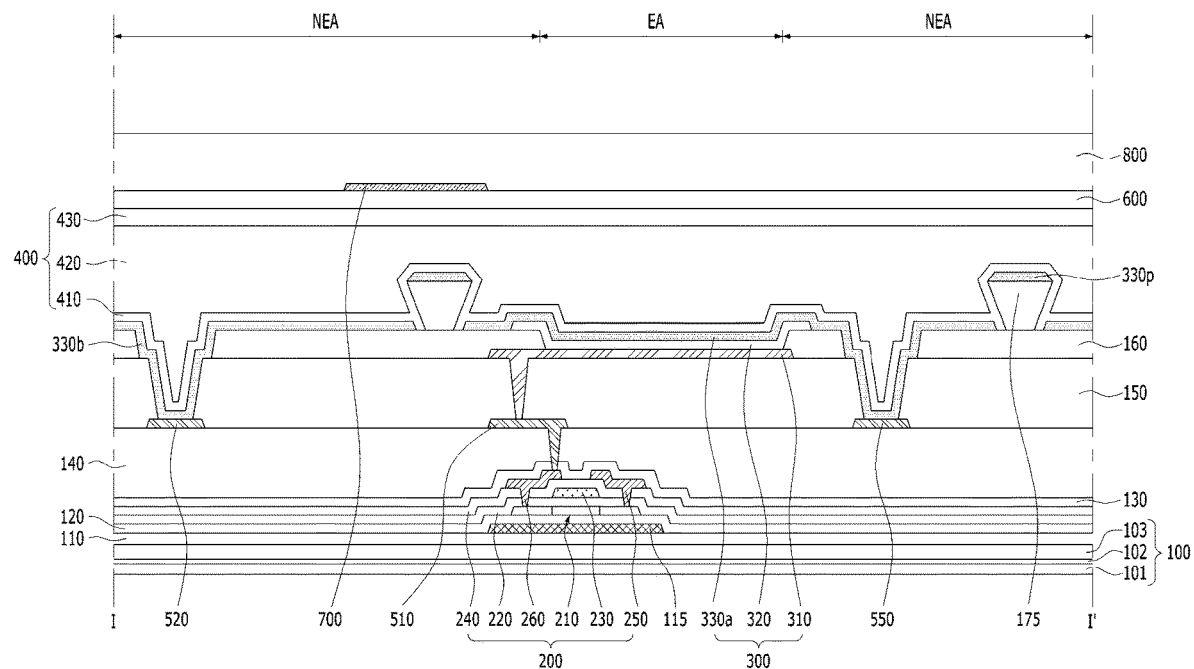
FIG. 3 is a view taken along I-I' of FIG. 2.
Figure 4:
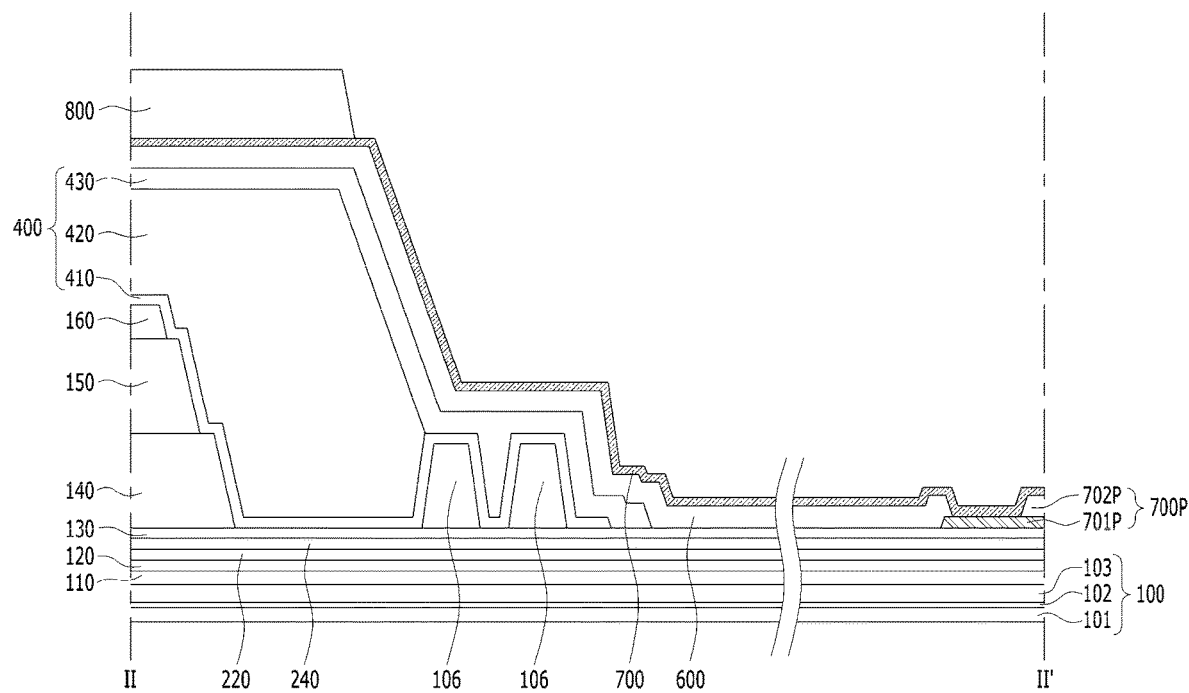
FIG. 4 is a view taken along II-II' of FIG. 2.
Figure 5:
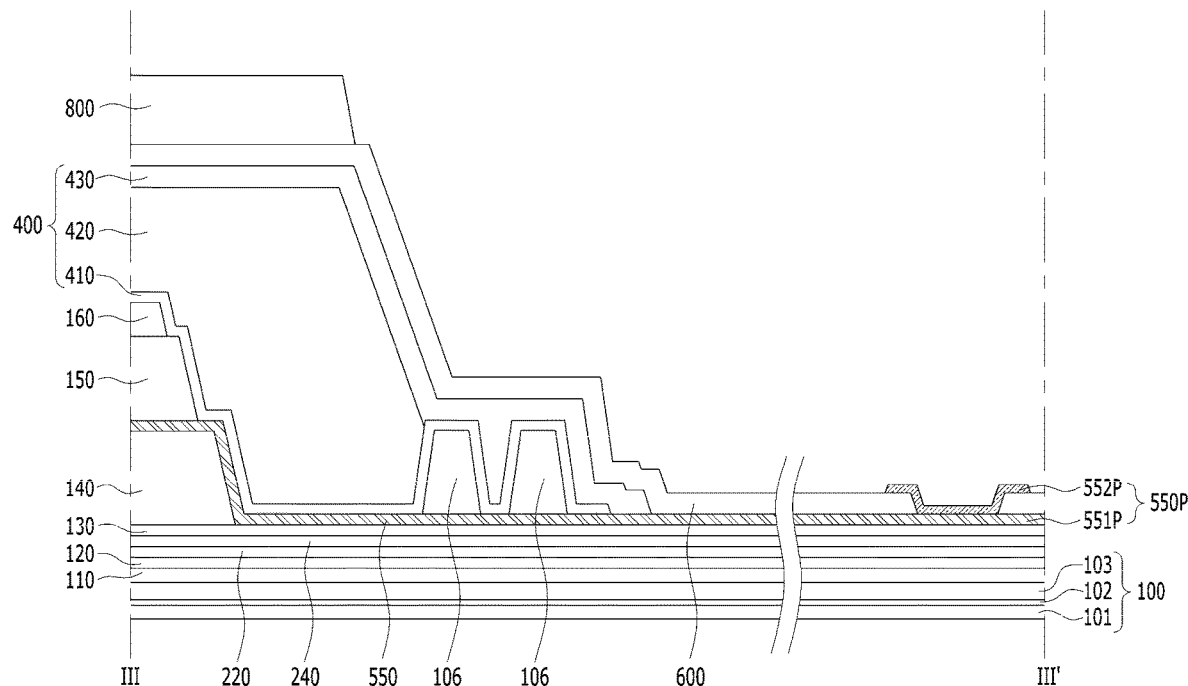
FIG. 5 is a view taken along III-III' of FIG. 2.

FIG. 1 is a view schematically showing a touch display apparatus according to an embodiment of the present disclosure. FIG. 2 is an enlarged view of K region in FIG. 1. FIG. 3 is a view taken along I-I' of FIG. 2. FIG. 4 is a view taken along II-II' of FIG. 2. FIG. 5 is a view taken along III-III' of FIG. 2.

Referring to FIGS. 1 to 5, the touch display apparatus according to embodiment of the present disclosure may include a display panel DP and driving parts or circuits DD, SD, TD and TC. The driving parts DD, SD, TD and TC may provide various signals for realizing an image to the display panel DP. For example, the driving parts DD, SD, TD and TC may include a data driver DD applying a data signal, a scan driver SD applying a scan signal and a timing controller TC. The timing controller TC may apply a digital video data and a source timing control signal to the data driver DD, and apply clock signals, reverse clock signals and start signals to the scan driver SD.

The display panel DP may generate an image provided to a user. For example, the display panel DP may include light-emitting devices 300 on a device substrate 100. The device substrate 100 may have a multi-layer structure. For example, the device substrate 100 may have a stacked structure of a first substrate layer 101, a substrate insulating layer 102 and a second substrate layer 103. The second substrate layer 103 may include the same material as the first substrate layer 101. For example, the first substrate layer 101 and the second substate layer 103 may include a polymer material, such as poly-imide (PI). The substrate insulating layer 102 may include an insulating material. Thus, in the touch display apparatus according to the embodiment of the present disclosure, the device substrate 100 may have high flexibility. Therefore, in the touch display apparatus according to the embodiment of the present disclosure, the damage of the light-emitting devices 300 due to an external impact may be prevented.

The device substrate 100 may include emission areas EA and a non-emission area NEA. The non-emission area NEA may be disposed outside the emission areas EA. For example, each of the emission areas EA may be surrounded by the non-emission area NEA.

The light-emitting devices 300 may be disposed on the emission areas EA of the device substrate 100. Each of the light-emitting devices 300 may emit light displaying a specific color. For example, each of the light-emitting devices 300 may include a pixel electrode 310, a light-emitting layer 320 and a first upper electrode 330a, which are sequentially stacked on one of the emission areas EA of the device substrate 100.

The pixel electrode 310 may include a conductive material. The pixel electrode 310 may have a high reflectance. For example, the pixel electrode 310 may include a metal, such as aluminum (Al) and silver (Ag). The pixel electrode 310 may have a multi-layer structure. For example, the pixel electrode 310 may have a structure in which a reflective electrode formed of a metal is disposed between transparent electrodes formed of a transparent conductive material, such as ITO and IZO.

The light-emitting layer 320 may generate light having luminance corresponding to a voltage difference between the pixel electrode 310 and the first upper electrode 330a. For example, the light-emitting layer 320 may include an emission material layer (EML) including an emission material. The emission material may include an organic material, an inorganic material or a hybrid material. For example, the touch display apparatus according to the embodiment of the present disclosure may be an organic light-emitting display apparatus including the emission material layer formed of an organic material. The light-emitting layer 320 may have a multi-layer structure. For example, the light-emitting layer 320 may include at least one of a hole injection layer (HIL), a hole transmitting layer (HTL), an electron transmitting layer (ETL) and an electron injection layer (EIL). Thus, in the touch display apparatus according to the embodiment of the present disclosure, the luminous efficiency of each light-emitting devices 300 may be increased.

The first upper electrode 330a may include a conductive material. The first upper electrode 330a may include a material different from the pixel electrode 310. The first upper electrode 330a may have a higher transmittance than the pixel electrode 310. For example, the first upper electrode 330a may be a transparent electrode formed of a transparent conductive material, such as ITO and IZO. Thus, in the touch display apparatus according to the embodiment of the present disclosure, the light generated from the light-emitting layer 320 may be emitted to the outside through the first upper electrode 330a.

Driving circuits may be disposed between the device substrate 100 and the light-emitting devices 300. Each of the driving circuits may be electrically connected to one of the light-emitting devices 300. Each of the driving circuits may be controlled by signals transmitted from the driving parts DD, SD, TD and TC. For example, each of the driving circuits may provide a driving current corresponding the data signal to the corresponding light-emitting device 300 according to the scan signal. Each of the driving circuits may include at least one thin film transistor 200. For example, the thin film transistor 200 may include a semiconductor pattern 210, a gate insulating layer 220, a gate electrode 230, an interlayer insulating layer 240, a source electrode 250 and a drain electrode 260.

The semiconductor pattern 210 may include a semiconductor material. For example, the semiconductor pattern 210 may include amorphous silicon (a-Si) or polycrystalline silicon (poly-Si). The semiconductor pattern 210 may be an oxide semiconductor. For example, the semiconductor pattern 210 may include a metal oxide, such as IGZO. The semiconductor pattern 210 may include a source region, a drain region and a channel region. The channel region may be disposed between the source region and the drain region. The source region and the drain region may have a lower resistance than the channel region.

The gate insulating layer 220 may be disposed on the semiconductor pattern 210. The gate insulating layer 220 may extend beyond the semiconductor pattern 210. For example, a side of the semiconductor pattern 210 may be covered by the gate insulating layer 220. The gate insulating layer 220 may include an insulating material. For example, the gate insulating layer 220 may include silicon oxide (SiO) and/or silicon nitride (SiN). The gate insulating layer 220 may include a material having a high dielectric constant. For example, the gate insulating layer 220 may include a high-K material, such as hafnium oxide (HfO). The gate insulating layer 220 may have a multi-layer structure.

The gate electrode 230 may be disposed on the gate insulating layer 220. The gate electrode 230 may include a conductive material. For example, the gate electrode 230 may include a metal, such as aluminum (Al), titanium (Ti), copper (Cu), chrome (Cr), molybdenum (Mo) and tungsten (W). The gate electrode 230 may be insulated from the semiconductor pattern 210 by the gate insulating layer 220. The gate electrode 230 may overlap the channel region of the semiconductor pattern 210. For example, the channel region of the semiconductor pattern 210 may have electrical conductivity corresponding to a voltage applied to the gate electrode 230.

The interlayer insulating layer 240 may be disposed on the gate electrode 230. The interlayer insulating layer 240 may extend beyond the gate electrode 230. For example, a side of the gate electrode 230 may be covered by the interlayer insulating layer 240. The interlayer insulating layer 240 may be in direct contact with the gate insulating layer 220 at the outside of the gate electrode 230. The interlayer insulating layer 240 may include an insulating material. For example, the interlayer insulating layer 240 may include silicon oxide (SiO).

The source electrode 250 may be disposed on the interlayer insulating layer 240. The source electrode 250 may include a conductive material. For example, the source electrode 250 may include a metal, such as aluminum (Al), titanium (Ti), copper (Cu), chrome (Cr), molybdenum (Mo) and tungsten (W). The source electrode 250 may be insulated from the gate electrode 230 by the interlayer insulating layer 240. For example, the source electrode 250 may include a material different from the gate electrode 230. The source electrode 250 may be electrically connected to the source region of the semiconductor pattern 210. For example, the gate insulating layer 220 and the interlayer insulating layer 240 may include a source contact hole partially exposing the source region of the semiconductor pattern 210. The source electrode 250 may include a portion overlapping with the source region of the semiconductor pattern 210. For example, the source electrode 250 may be in direct contact with the source region of the semiconductor pattern 210 within the source contact hole.

The drain electrode 260 may be disposed on the interlayer insulating layer 240. The drain electrode 260 may include a conductive material. For example, the drain electrode 260 may include a metal, such as aluminum (Al), titanium (Ti), copper (Cu), chrome (Cr), molybdenum (Mo) and tungsten (W). The drain electrode 260 may be insulated from the gate electrode 230 by the interlayer insulating layer 240. For example, the drain electrode 260 may include a material different from the gate electrode 230. The drain electrode 260 may include the same material as the source electrode 250. The drain electrode 260 may be electrically connected to the drain region of the semiconductor pattern 210. The drain electrode 260 may be spaced away from the source electrode 250. For example, the gate insulating layer 220 and the interlayer insulating layer 240 may include a drain contact hole partially exposing the drain region of the semiconductor pattern 210. The drain electrode 260 may include a portion overlapping with the drain region of the semiconductor pattern 210. For example, the drain electrode 260 may be in direct contact with the drain region of the semiconductor pattern 210 within the drain contact hole.

A first buffer layer 110 may be disposed between the device substrate 100 and the driving circuits. The first buffer layer 110 may prevent pollution due to the device substrate 100 in a process of forming the thin film transistors 200. For example, the first buffer layer 110 may completely cover an upper surface of the device substrate 100 toward the light-emitting devices 300. The first buffer layer 110 may include an insulating material. For example, the first buffer layer 110 may include silicon oxide (SiO) and/or silicon nitride (SiN). The first buffer layer 110 may have a multi-layer structure.

A light-blocking pattern 115 may be disposed between the first buffer layer 110 and each thin film transistor 200. The light-blocking pattern 115 may prevent characteristics change of each thin film transistor 200 due to external light. For example, the light-blocking pattern 115 may include a portion overlapping with the semiconductor pattern 210 of each thin film transistor 200. The light-blocking pattern 115 may include a material that blocks or absorbs the light. For example, the light-blocking pattern 115 may include a metal, such as aluminum (Al), silver (Ag) and copper (Cu).

The light-blocking pattern 115 may be insulated from the semiconductor pattern 210 of each thin film transistor 200. For example, a second buffer layer 120 may be disposed between the light-blocking pattern 115 and the thin film transistors 200. The second buffer layer 120 may include an insulating material. For example, the second buffer layer 120 may include silicon oxide (SiO) or silicon nitride (SiN). The second buffer layer 120 may include the same material as the first buffer layer 110. The second buffer layer 12 may extend beyond the light-blocking pattern 115. For example, the second buffer layer 120 may be in direct contact with the first buffer layer 110 at the outside of the light-blocking pattern 115.

A lower passivation layer 130 may be disposed on the driving circuits. The lower passivation layer 130 may prevent the damage of the driving circuits due to the external impact and moisture. For example, an upper surface of each thin film transistor 200 opposite to the device substrate 100 may be covered by the lower passivation layer 130. The lower passivation layer 130 may include an insulating material. For example, the lower passivation layer 130 may include an inorganic insulating material, such as silicon oxide (SiO) and silicon nitride (SiN).

A lower planarization layer 140 and an upper planarization layer 150 may be sequentially stacked on the lower passivation layer 130. The lower planarization layer 140 and the upper planarization layer 150 may remove a thickness difference due to the driving circuits. For example, an upper surface of the upper planarization layer 150 toward the light-emitting devices 300 may be a flat surface. The lower planarization layer 140 and the upper planarization layer 150 may include an insulating material. For example, the lower planarization layer 140 and the upper planarization layer 150 may include organic insulating material. The upper planarization layer 150 may include a material different from the lower planarization layer 140. Thus, in the touch display apparatus according to the embodiment of the present disclosure, the thickness difference due to the driving circuits may be effectively removed.

The pixel electrode 310, the light-emitting layer 320 and the first upper electrode 330a of each light-emitting device 300 may be sequentially stacked on the upper planarization layer 150. For example, the pixel electrode 310 of each light-emitting device 300 may be electrically connected to one of the thin film transistors 200. Intermediate electrodes 510 may be disposed between the lower planarization layer 140 and the upper planarization layer 150. The intermediate electrodes 510 may include a conductive material. For example, the intermediate electrodes 510 may include a metal, such as aluminum (Al), titanium (Ti), copper (Cu), chrome (Cr), molybdenum (Mo) and tungsten (W). Each of the intermediate electrodes 510 may be electrically connected to the drain electrode 260 of one of the thin film transistors 200 by penetrating the lower planarization layer 140. For example, the pixel electrode 310 of each light-emitting device 300 may be connected to the corresponding thin film transistor 200 through the one of the intermediate electrodes 510. Each of the intermediate electrodes 510 may include a portion overlapping with the drain electrode 260 of one of the thin film transistors 200 and a portion overlapping with the pixel electrode 310 of one of the light-emitting devices 300. For example, the pixel electrode 310 of each light-emitting device 300 may be connected to the corresponding intermediate electrode 510 by penetrating the upper planarization layer 150.

A bank insulating layer 160 may be disposed on the upper planarization layer 150. The bank insulating layer 160 may include an insulating material. For example, the bank insulating layer 160 may include an organic insulating material. The bank insulating layer 160 may include a material different from the lower planarization layer 140 and the upper planarization layer 150. The bank insulating layer 160 may cover an edge of each pixel electrode 310. The light-emitting layer 320 and the first upper electrode 330a of each light-emitting device 300 may be stacked on a portion of the corresponding pixel electrode 310 which is exposed by the bank insulating layer 160. For example, the emission areas EA of the device substrate 100 may be defined by (e.g., laterally surrounded by) the bank insulating layer 160. For example, the non-emission area NEA of the device substrate 100 may overlap the bank insulating layer 160.

The light emitted from each light-emitting device 300 may display a color different from the light emitted from adjacent light-emitting device 300. For example, the light-emitting layer 320 of each light-emitting device 300 may include a material different from the light-emitting layer 320 of adjacent light-emitting device 300. The light-emitting layer 320 of each light-emitting device 300 may be spaced away from the light-emitting layer 320 of adjacent light-emitting device 300. For example, the light-emitting layer 320 of each light-emitting device 300 may include an end which is disposed on the bank insulating layer 160.

A voltage applied to the first upper electrode 330a of each light-emitting device 300 may be the same as a voltage applied to the first upper electrode 330a of another light-emitting device 300 adjacent to the corresponding light-emitting device 300 in a first direction. For example, the first upper electrode 330a of each light-emitting device 300 may be electrically connected to the first upper electrode 330a of the another light-emitting device 300 adjacent to the corresponding light-emitting device 300 in the first direction. The first upper electrode 330a of each light-emitting device 300 may include the same material as the first upper electrode 330a of the another light-emitting device 300 adjacent to the corresponding light-emitting device 300 in the first direction. For example, the first upper electrode 330a of each light-emitting device 300 may extend over the emission area EA adjacent to the corresponding light-emitting device 300 in the first direction. The first upper electrode 330a of each light-emitting device 300 may be in direct contact with the first upper electrode 330a of the another light-emitting device 300 adjacent in the first direction. The emission areas EA may be arranged in a zig-zag shape, as illustrated in FIG. 2. For example, each of the emission areas EA may be arranged to alternate with the emission area EA which is disposed adjacent to the corresponding emission area EA in the first direction. The first upper electrode 330a of each light-emitting device 300 may extend in a zig-zag shape. It should be understood that "adjacent . . . in the first direction" includes the meaning of "nearest . . . in the first direction," while allowing for offset in the second direction within a band of tolerance. For example, the emission areas EA shown in FIG. 2 are arranged in two zig-zagging lines, each extending in the first direction (e.g., the horizontal direction relative to the page). The two zig-zagging lines are arranged along the vertical direction relative to the page, do not overlap each other, and are separated by the second upper electrode 330b. The first upper electrodes 330a follow the zig-zag shape of the respective zig-zagging lines, and overlap (e.g., completely cover) the respective emission areas EA thereof. Each emission area EA is neighbored by one or two other emission areas EA along the first direction. The other emission areas EA may be offset from the first direction relative to the emission area EA by an angle, such as about 45°, as shown in FIG. 2. An angle of 0° corresponds to the emission areas EA being arranged collinearly (e.g., no zig-zag). The angle of offset is between 0° and less than 90°.

The first upper electrode 330a of each light-emitting device 300 may be spaced away from the first upper electrode 330a of another light-emitting device 300 adjacent in a second direction (e.g., the vertical direction relative to the page in FIG. 2) perpendicular to the first direction. For example, second upper electrodes 330b may be disposed between first upper electrodes 330a that are disposed adjacent to each other in the second direction. The second upper electrodes 330b may extend side by side with the first upper electrodes 330a. The second upper electrodes 330b may have the same shape as the first upper electrodes 330a. For example, each of the second upper electrodes 330b may extend in a zig-zag shape. The second upper electrodes 330b may be disposed outside the emission areas EA. For example, each of the second upper electrodes 330b may extend between the emission areas EA. The second upper electrodes 330b extending "side by side" with the first upper electrodes 330a includes the meaning that the first and second upper electrodes 330a, 330b are arranged in the vertical direction in an alternating manner, as shown in FIG. 2. For example, a first upper electrode 330a may be most proximal an encapsulating dam 106, followed by a second upper electrode 330b, followed by another first upper electrode 330a, followed by another second upper electrode 330b, and so on over the area of the display panel DP. It should also be understood that the "zig-zag shape" includes the meaning of a number of shapes, such as an S-shape (or sinusoidal shape), e.g., a shape that has curved corners instead of the angular corners illustrated in FIG. 2.

The second upper electrodes 330b may include a conductive material. For example, the second upper electrodes 330b may include a transparent material. For example, the second upper electrodes 330b may be a transparent electrode formed of a transparent conductive material, such as ITO and IZO. The second upper electrodes 330b may include the same material as the first upper electrodes 330a. For example, the second upper electrodes 330b may be formed simultaneously with the first upper electrodes 330a. The second upper electrodes 330b may be disposed on the bank insulating layer 160. The second upper electrodes 330b may be separated from the first upper electrodes 330a. For example, separating partitions 175 having a side of reveres taper may be disposed between the first upper electrodes 330a and the second upper electrodes 330b. Each of the separating partitions 175 may extend between the first upper electrodes 330a and the second upper electrodes 330b. The separating partitions 175 may be disposed on the bank insulating layer 160. Thus, in the touch display apparatus according to the embodiment of the present disclosure, the first upper electrodes 330a and the second upper electrodes 330b may be simultaneously formed in a process of deposition of a transparent conductive material on the bank insulating layer 160, without an additional patterning process. For example, electrode pattern 330p including the same material as the first upper electrodes 330a and the second upper electrodes 330b may be disposed on an upper surface of each separating partition 175. Therefore, in the touch display apparatus according to the embodiment of the present disclosure, the process efficiency may be improved.

The separating partitions 175 may include an insulating material. For example, the separating partitions 175 may include an organic insulating material. Each of the separating partitions 175 may have a multi-layer structure. For example, each of the separating partitions 175 may have a stacked structure of layers, which include a material having an etch selectivity.

First link wires 550 may be disposed between the lower planarization layer 140 and the upper planarization layer 150. Each of the first upper electrodes 330a may be electrically connected to the one of the first link wires 550. For example, the upper planarization layer 150 and the bank insulating layer 160 may include first electrode contact holes exposing a portion of each first link wire 550. Each of the first upper electrodes 330a may include a portion overlapping with one of the first electrode contact holes. For example, each of the first upper electrodes 330a may be in direct contact with the corresponding first link wire 550 through one of the first electrode contact holes.

The first link wires 550 may include a conductive material. For example, the first link wires 550 may include a metal, such as aluminum (Al), titanium (Ti), copper (Cu), chrome (Cr), molybdenum (Mo) and tungsten (W). The first link wires 550 may include the same material as the intermediate electrodes 510. The first link wires 550 may extend in the second direction. The first link wires 550 may be insulated from the intermediate electrodes 510. For example, the first link wires 550 may be spaced away from the intermediate electrodes 510 in the first direction.

The first link wires 550 may be electrically connected to the power voltage supply source. For example, the power voltage may be applied to each of the first upper electrodes 330a by the corresponding first link wire 550. Each of the first upper electrodes 330a disposed adjacent to the corresponding first upper electrode 330a in the second direction may be connected to the same first link wire 550 as the first upper electrode 330a. Thus, in the touch display apparatus according to the embodiment of the present disclosure, the luminance difference due to voltage drop may be prevented.

Second link wires 520 may be disposed between the lower planarization layer 140 and the upper planarization layer 150. The second link wires 520 may include a conductive material. For example, the second link wires 520 may include a metal, such as aluminum (Al), titanium (Ti), copper (Cu), chrome (Cr), molybdenum (Mo) and tungsten (W). The second link wires 520 may include the same material as the intermediate electrodes 510 and the first link wires 550. The second link wires 520 may extend parallel to the first link wires 550. For example, the second link wires 520 may extend in the second direction. The second link wires 520 may be spaced away from the intermediate electrodes 510 and the first link wires 550 in the first direction.

The second link wires 520 may be electrically connected to the second upper electrodes 330b. For example, the upper planarization layer 150 and the bank insulating layer 160 may include second electrode contact holes exposing a portion of each second link wire 520. Each of the second upper electrodes 330b may include a portion overlapping with one of the second link wires 520. For example, each of the second upper electrodes 330b may be in direct contact with the corresponding second link wire 520 through one of the second electrode contact holes. Each of the second upper electrodes 330b may be connected to the same second link wire 520 as the second upper electrode 330b, which is disposed adjacent to the corresponding second upper electrode 330b in the second direction. Thus, in the touch display apparatus according to the embodiment of the present disclosure, a signal applied to the second upper electrodes 330b may be different from a signal applied to the first upper electrodes 330a.

An encapsulating element 400 may be disposed on the first upper electrodes 330a, the second upper electrodes 330b and the separating partitions 175, as shown in FIG. 3. The encapsulating element 400 may prevent the damage of the light-emitting devices 300 due to the external impact and moisture. The encapsulating element 400 may have a multi-layer structure. For example, the encapsulating element 400 may include a first encapsulating layer 410, a second encapsulating layer 420 and the third encapsulating layer 430, which are sequentially stacked. The first encapsulating layer 410, the second encapsulating layer 420 and the third encapsulating layer 430 may include an insulating material. The second encapsulating layer 420 may include a material different from the first encapsulating layer 410 and the third encapsulating layer 430. For example, the first encapsulating layer 410 and the third encapsulating layer 430 may include an inorganic insulating material, and the second encapsulating layer 420 may include an organic insulating material. Thus, in the touch display apparatus according to the embodiment of the present disclosure, the damage of the light-emitting devices 300 due to the external impact and moisture may be effectively prevented. A thickness difference due to the light-emitting devices 300 and the separating partitions 175 may be removed by the second encapsulating layer 420. For example, an upper surface of the encapsulating element 400 opposite to the device substrate 100 may be a flat surface. The side of each separating partition 175 having reverse taper may be covered by the encapsulating element 400.

At least one encapsulating dam 106 may be disposed on the device substrate 100, as shown in FIG. 4. The encapsulating dam 106 may block the flow of the second encapsulating layer 420 having a relatively high fluidity. For example, the second encapsulating layer 420 may be disposed on a portion of the device substrate 100 which is defined by (e.g., laterally surrounded by) the encapsulating dam 106. The first encapsulating layer 410 and the third encapsulating layer 430 may extend along a surface of the encapsulating dam 106. For example, the third encapsulating layer 430 may be in direct contact with the first encapsulating layer 410 at the outside of the encapsulating dam 106. The encapsulating dam 106 may include an insulating material. For example, the encapsulating dam 106 may include an organic insulating material. The encapsulating dam 106 may be disposed on the lower passivation layer 130. For example, the encapsulating dam 106 may include the same material as the lower planarization layer 140, the upper planarization layer 150 or both. Thus, in the touch display apparatus according to the embodiment of the present disclosure, the process efficiency may be improved.

The touch display apparatus according to the embodiment of the present disclosure may sense a touch of the user and/or a tool. For example, the driving parts DD, SD, TD and TC may include a touch sensing part TD. Touch wires 700 being electrically connected to the touch sensing part TD and a cover insulating layer 800 which is disposed on the touch wires 700 may be disposed on the encapsulating element 400, as shown in FIG. 4. The touch wires 700 may include a conductive material. For example, the touch wires 700 may include a metal, such as such chrome (Cr), molybdenum (Mo), tungsten (W) or a combination thereof. A touch buffer layer 600 may be disposed between the encapsulating element 400 and the touch wires 700. The touch buffer layer 600 may prevent the damage of the light-emitting devices 300 in a process of forming the touch wires 700. The touch buffer layer 600 may include an insulating material. For example, the touch buffer layer 600 may include an inorganic insulating material, such as silicon oxide (SiO) and silicon nitride (SiN). The cover insulating layer 800 may include an insulating material. The cover insulating layer 800 may include a material different from the touch buffer layer 600. For example, the cover insulating layer 800 may include an organic insulating material. A thickness difference due to the touch wires 700 may be removed by the cover insulating layer 800.

Each of the touch wires 700 may cross the first upper electrodes 330a and the second upper electrodes 330b. For example, the touch wires 700 may extend in the second direction, as illustrated in FIG. 2. The touch wires 700 may be disposed outside the emission areas EA. For example, the touch wires 700 may be disposed between the first link wires 550 and the second link wires 520.

The second link wires 520 may be electrically connected to the touch sensing part TD. The touch sensing part TD may apply a touch driving signal Tx and a touch sensing signal Rx to the display panel DP. For example, the touch driving signal Tx may be applied to each second upper electrode 330b by the second link wires 520, and the touch sensing signal Rx may be applied to each touch wire 700.

Accordingly, the touch display apparatus according to the embodiment of the present disclosure may sense the touch of the user and/or the tool by using the second upper electrodes 330b and the touch wires 700, wherein the second upper electrodes 330b may be disposed between the non-emission area NEA of the device substrate 100 and the encapsulating layer 400, and wherein the touch wires 700 may be disposed on the encapsulating layer 400. Thus, in the touch display apparatus according to the embodiment of the present disclosure, a process of forming the touch wires 700 on the encapsulating element 400 may be simplified. Therefore, in the touch display apparatus according to the embodiment of the present disclosure, the process efficiency may be improved.

Also, in the touch display apparatus according to the embodiment of the present disclosure, the signal applied to the first upper electrodes 330a which overlap the emission areas EA may be not affected by sensing the touch. Thus, in the touch display apparatus according to the embodiment of the present disclosure, sensing the touch and realizing the image (e.g., displaying the image) may be simultaneously performed.

The display panel DP may be electrically connected to the driving parts DD, SD, TD and TC through pads 520p, 550p and 700p. For example, first link pads 550p electrically connected to the first link wires 550, second link pads 520p electrically connected to the second link wires 520 and touch pads 700p electrically connected to the touch wires 700 may be disposed on a portion of the device substrate 100. The first link pads 550p, the second link pads 520p and the touch pads 700p may be disposed outside the encapsulating dam 106. For example, the first link pads 550p, the second link pads 520p and the touch pads 700p may be spaced away from the encapsulating element 400.

Each of the first link wires 550 may be connected to one of the first link pads 550p by extending along the lower passivation layer 130, as shown in FIG. 5. For example, each of the first link pads 550p may include a first lower link pad 551p which has the same material as the first link wires 550. The touch buffer layer 600 may extend beyond the encapsulating dam 106. For example, the touch buffer layer 600 may include first pad contact holes partially exposing the first lower link pad 551p of each first link pad 550p. Each of first link pads 550p may include a first upper link pad 552p which is disposed on the touch buffer layer 600. The first upper link pad 552p of each first link pad 550p may be connected to (e.g., in direct contact with) the first lower link pad 551p of the corresponding first link pad 550p through one of the first pad contact holes. The first upper link pad 552p of each first link pad 550p may include a conductive material. For example, the first upper link pad 552p of each first link pad 550p may include a metal, such as aluminum (Al), titanium (Ti), copper (Cu), chrome (Cr), molybdenum (Mo) and tungsten (W). The first upper link pad 552p of each first link pad 550p may include the same material as a conductive layer which is disposed on the first link wires 550. For example, the first upper link pad 552p of each first link pad 550p may include the same material as the touch wires 700. Each first lower link pad 551p, which may have the same material as a respective one of the first link wires 550, may be integrally formed with the first link wire 550. For example, the first link wire 550 shown in FIG. 5 and the first lower link pad 551p may be a continuous, unbroken layer of conductive material with no visible interface between the first link wire 550 and the first lower link pad 551p.

Each of the second link wires 520 may be connected to one of the second link pads 520p by extending along the lower passivation layer 130. Each of the second link pads 520p may have a stacked structure the same as or similar to the first link pads 550p shown in FIG. 5. For example, each of second link pads 520p may have a stacked structure of a second lower link pad and a second upper link pad. The second lower link pad of each second link pad 520p may include the same material as the second link wires 520. The second upper link pad of each second link pad 520p may include the same material as the touch wires 700. For example, the touch buffer layer 600 may include second pad contact holes exposing a portion of each second lower link pad. The second upper link pad of each second link pad 520p may be connected to (e.g., in direct contact with) the second lower link pad of the corresponding second link pad 520p through one of the second pad contact holes. Each second lower link pad, which may have the same material as a respective one of the second link wires 520, may be integrally formed with the second link wire 520. For example, the second link wire 520 and the second lower link pad may be a continuous, unbroken layer of conductive material with no visible interface between the second link wire 520 and the second lower link pad.

Each of the touch wires 700 may be connected to one of the touch pads 700p by extending along the touch buffer layer 600, as shown in FIG. 4. For example, each of the touch wires 700 may extend beyond the encapsulating dam 106 along a surface of the encapsulating element 400 which is opposite to the device substrate 100. Each of the touch pads 700p may have a stacked structure the same as or similar to the first link pads 550p and the second link pads 520p. For example, each of the touch pads 700p may have a stacked structure of a lower touch pad 701p and an upper touch pad 702p. The lower touch pad 701p of each touch pad 700p may be disposed on the same layer as the first lower link pads 551p. For example, the lower touch pad 701p of each touch pad 700p may be disposed between the lower passivation layer 130 and the touch buffer layer 600. The lower touch pad 701p of each touch pad 700p may include the same material as the first lower link pads 551p. The touch buffer layer 600 may include touch pad contact holes partially exposing the lower touch pad 701p of each touch pad 700p. The upper touch pad 702p of each touch pad 700p may be disposed on the touch buffer layer 600. For example, the upper touch pad 702p of each touch pad 700p may be connected to (e.g., in direct contact with) the lower touch pad 701p of the corresponding touch pad 700p through one of the touch pad contact holes. The upper touch pad 702p of each touch pad 700p may include the same material as the touch wires 700. For example, the upper touch pad 702p of each touch pad 700p may be in direct contact with the corresponding touch wire 700. Each upper touch pad 702p, which may have the same material as a respective one of the touch wires 700, may be integrally formed with the touch wire 700. For example, the touch wire 700 shown in FIG. 4 and the upper touch pad 702p may be a continuous, unbroken layer of conductive material with no visible interface between the touch wire 700 and the upper touch pad 702p.

The touch display apparatus according to the embodiment of the present disclosure is described that realizing the image and sensing the touch are simultaneously performed. However, in the touch display apparatus according to another embodiment of the present disclosure, the first upper electrodes 330a may be selectively connected to the touch sensing part TD by the first link wires 550. That is, in the touch display apparatus according to another embodiment of the present disclosure, both of the first upper electrodes 330a and the second upper electrodes 330b may be used as touch electrodes. For example, in the touch display apparatus according to another embodiment of the present disclosure, each frame may be divided into a display period and a touch period. During the display period of each frame, the power voltage may be supplied to the first upper electrodes 330a. During the touch period of each frame, the touch driving signal Tx may be applied to the first upper electrodes 330a. Thus, in the touch display apparatus according to another embodiment of the present disclosure, the accuracy of touch sensing may be improved.

Figure 6:
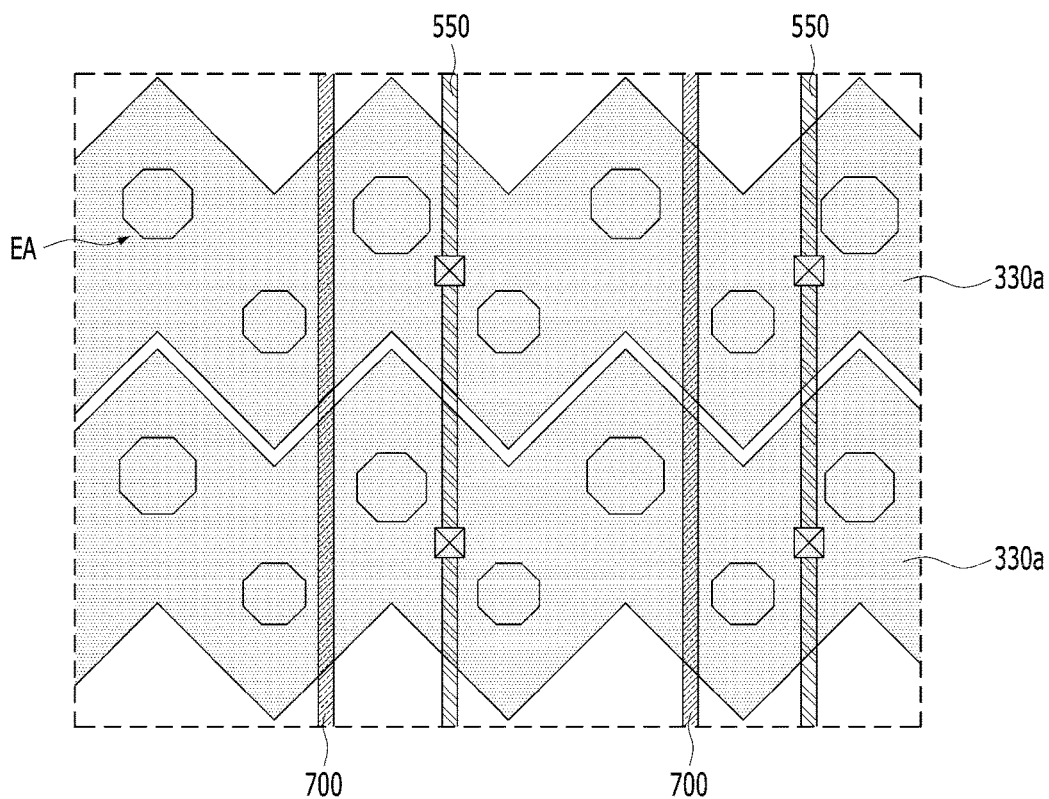
FIGS. 6 and 7 are views showing the touch display apparatus according another embodiment of the present disclosure.

The touch display apparatus according to the embodiments of the present disclosure is described that the touch of the user and/or the tool is sensed by using the second upper electrodes 330b on the non-emission area NEA of the device substrate 100. However, in the touch display apparatus according to another embodiment of the present disclosure, the first upper electrodes 330a overlapping with a portion of the emission areas EA and the touch wires 700 may sense the touch of the user and/or the tool. For example, in the touch display apparatus according to another embodiment of the present disclosure, the first upper electrodes 330a extending in the first direction may be separated from each other, as shown in FIG. 6, for example, by the separating partitions 175 shown in FIG. 3. The emission areas EA may overlap one of the first upper electrodes 330a. The touch wires 700 may cross the first touch electrodes 330a. Each of the first upper electrodes 330a may be selectively connected to the touch sensing part by the one of the first link wires 550. Thus, in the touch display apparatus according to another embodiment of the present disclosure, the number of the signal wires for sensing the touch and an area occupied by the signal wires may be minimized or reduced. Therefore, in the touch display apparatus according to another embodiment of the present disclosure, a process of forming components for sensing the touch may be simplified.

Figure 7:
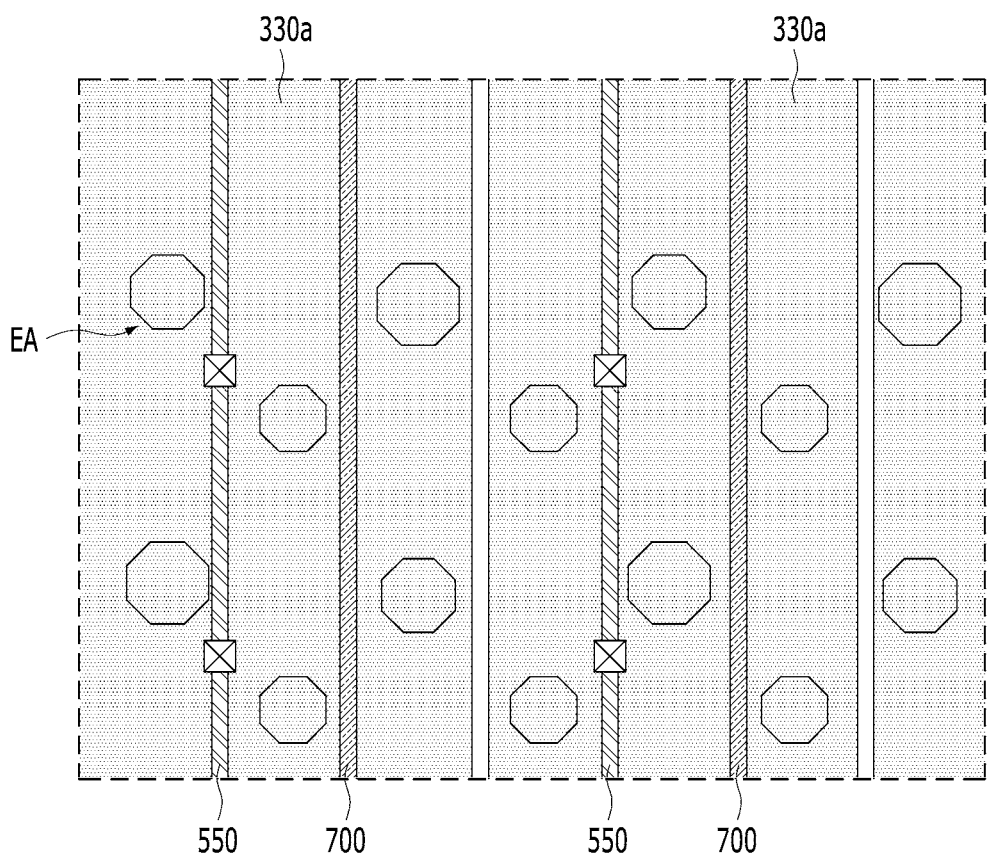

The touch display apparatus according to the embodiment of the present disclosure is described that the second upper electrodes 330b which are used for sensing the touch cross the touch wires 700. However, in the touch display apparatus according to another embodiment of the present disclosure, the electrodes used for sensing the touch may be arranged in various shapes. For example, in the touch display apparatus according to another embodiment of the present disclosure, the first upper electrodes 330a separated by the separating partitions 175 may extend parallel to the touch wires 700, as shown in FIG. 7. For example, each of the first upper electrodes 330a may overlap one of the touch wires 700. The first link wires 550 applying the power voltage or the touch signal to the first upper electrodes 330a may extend parallel to the touch wires 700. For example, each of the first touch electrodes 330a may include a portion overlapping with the corresponding first link wire 550. Thus, in the touch display apparatus according to another embodiment of the present disclosure, the degree of freedom for shape of the first upper electrodes 330a may be improved.

In the result, the touch display apparatus according to the embodiments of the present disclosure may include the touch wire which is disposed on the encapsulating element covering the light-emitting device, wherein the upper electrode of the light-emitting device may extend in a direction, and wherein the touch wire may include a portion overlapping with the upper electrode. That is, in the touch display apparatus according to the embodiments of the present disclosure, the touch of the user and/or the tool may be sensed by the upper electrode of the light-emitting device and the touch wire. Thus, in the touch display apparatus according to the embodiments of the present disclosure, components for sensing the touch may be simplified. Thereby, in the touch display apparatus according to the embodiments of the present disclosure, the process efficiency may be improved.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A touch display apparatus comprising:
a device substrate including emission areas;
pixel electrodes, each of the pixel electrodes disposed on one of the emission areas of the device substrate;
a bank insulating layer on the device substrate, the bank insulating layer covering an edge of each pixel electrode;
light-emitting layers, each of the light-emitting layers disposed on a portion of one of the pixel electrodes exposed by the bank insulating layer;
a first upper electrode on the bank insulating layer and the light-emitting layers, the first upper electrode extending in a first direction;
a first link wire disposed between the device substrate and the bank insulating layer, the first link wire being connected to the first upper electrode;
an encapsulating element on the first upper electrode; and
a touch wire on the encapsulating element, the touch wire including a portion overlapping with the first upper electrode.

2. The touch display apparatus according to claim 1, wherein the touch wire extends in a second direction perpendicular to the first direction.

3. The touch display apparatus according to claim 1, further comprising:
a second upper electrode extended side by side with the first upper electrode; and
a second link wire disposed between the device substrate and the bank insulating layer, the second link wire being connected to the second upper electrode,
wherein the second link wire is spaced away from the first link wire.

4. The touch display apparatus according to claim 3, wherein the second upper electrode includes the same material as the first upper electrode.

5. The touch display apparatus according to claim 3, wherein the second link wire includes the same material as the first link wire.

6. The touch display apparatus according to claim 3, wherein the first upper electrode is insulated from the second link wire, and the second upper electrode is insulated from the first link wire.

7. The touch display apparatus according to claim 3, wherein the emission areas are arranged in a zig-zag shape, and wherein the first upper electrode and the second upper electrode extend in a zig-zag shape.

8. The touch display apparatus according to claim 7, wherein the second upper electrode extends between the emission areas.

9. The touch display apparatus according to claim 1, wherein the touch wire extends between the emission areas.

10. The touch display apparatus according to claim 1, further comprising a separating partition on the bank insulating layer,
wherein the separating partition has a side of reverse taper, and wherein the separating partition extends along an edge of the first upper electrode.

11. A touch display apparatus, comprising:
a device substrate having:
emission areas; and
a non-emission area disposed outside the emission areas;
light-emitting layers, each of the light-emitting layers overlapping a respective emission area of the device substrate;
an upper electrode including:
a first upper electrode extending in a first direction, the first upper electrode overlapping the light-emitting layers; and
a second upper electrode extending in the first direction and offset from the first upper electrode in a second direction perpendicular to the first direction;
an encapsulating element on the upper electrode; and
a touch wire on the encapsulating element, the touch wire extending in the second direction.

12. The touch display apparatus of claim 11, further comprising an encapsulating dam;
wherein the encapsulating element extends beyond the encapsulating dam; and
wherein the touch wire extends beyond the encapsulating dam.

13. The touch display apparatus of claim 12, further comprising:

a touch pad including an upper touch pad and a lower touch pad; and a touch buffer layer between the touch wire and the encapsulating element, the touch buffer layer extending beyond the encapsulating dam and over the touch pad, the touch buffer layer exposing the lower touch pad, the upper touch pad being connected to the lower touch pad through the touch buffer layer.

14. The touch display apparatus of claim 12, further comprising:

a first link wire extending parallel to the touch wire; and a first link pad electrically connected to the first link wire, the first link pad including a first upper link pad and a first lower link pad;

wherein the first link wire is between the device substrate and the light-emitting layer;

wherein the first upper link pad includes the same material as the touch wire.

15. The touch display apparatus of claim 12, further comprising:

a cover insulating layer over the touch wire.

16. The touch display apparatus of claim 11, further comprising:

a separating partition laterally separating the first upper electrode from the second upper electrode;

wherein the touch wire overlaps the separating partition.

17. The touch display apparatus of claim 16, further comprising:

a first link wire electrically connected to the first upper electrode; and a second link wire electrically connected to the second upper electrode;

wherein the first link wire and the second link wire on opposite sides of the separating partition from each other.

18. The touch display apparatus of claim 17, wherein the first link wire and the second link wire extend in the second direction and are disposed over the non-emission area of the device substrate.

* * * * *